US007582398B2

(12) United States Patent
Iftime et al.

(10) Patent No.: US 7,582,398 B2
(45) Date of Patent: Sep. 1, 2009

(54) INKLESS REIMAGEABLE PRINTING PAPER AND METHOD

(75) Inventors: Gabriel Iftime, Mississauga (CA); Peter M. Kazmaier, Mississauga (CA); Tyler B. Norsten, Oakville (CA)

(73) Assignee: Xerox Corporation, Norwalk, CT (US)

( * ) Notice: Subject to any disclaimer, the term of this patent is extended or adjusted under 35 U.S.C. 154(b) by 0 days.

(21) Appl. No.: 11/762,157

(22) Filed: Jun. 13, 2007

(65) Prior Publication Data
US 2008/0311492 A1 Dec. 18, 2008

(51) Int. Cl.
G03F 7/00 (2006.01)
G03F 7/004 (2006.01)

(52) U.S. Cl. .................. 430/19; 430/270.1; 430/905; 430/913

(58) Field of Classification Search .................. 430/19, 430/270.1, 913, 905
See application file for complete search history.

(56) References Cited

U.S. PATENT DOCUMENTS

| 3,825,427 | A | 7/1974 | Inoue et al. |
| 3,877,941 | A | 4/1975 | Lohmann |
| 3,961,948 | A | 6/1976 | Saeva |
| 4,425,161 | A | 1/1984 | Shibahashi et al. |
| 4,598,035 | A | 7/1986 | Usami et al. |
| 4,659,649 | A | 4/1987 | Dickinson et al. |
| 4,931,337 | A | 6/1990 | Miyazaki et al. |
| 5,124,236 | A | 6/1992 | Yamaguchi et al. |
| 5,262,280 | A * | 11/1993 | Knudsen et al. ............. 430/312 |
| 5,376,511 | A | 12/1994 | Tatezono et al. |
| 5,458,874 | A | 10/1995 | Pereira et al. |
| 5,677,107 | A | 10/1997 | Neckers |
| 5,691,100 | A | 11/1997 | Kudo et al. |
| 5,691,395 | A * | 11/1997 | Knudsen et al. ............. 522/31 |
| 5,747,225 | A | 5/1998 | Manico et al. |
| 6,067,185 | A | 5/2000 | Albert et al. |
| 6,103,378 | A | 8/2000 | Yao et al. |
| 6,200,646 | B1 | 3/2001 | Neckers et al. |
| 6,528,221 | B2 | 3/2003 | Takezawa et al. |
| 6,579,662 | B1 | 6/2003 | Zheng et al. |
| 6,680,281 | B2 | 1/2004 | Tajiri et al. |
| 6,761,758 | B2 | 7/2004 | Boils-Boissier et al. |
| 6,866,981 | B2 | 3/2005 | Furukawa et al. |
| 6,867,408 | B1 | 3/2005 | Gu et al. |
| 6,906,118 | B2 | 6/2005 | Goodbrand et al. |
| 7,018,714 | B2 | 3/2006 | Kobayashi et al. |
| 7,057,054 | B2 | 6/2006 | Irie et al. |
| 7,205,088 | B2 | 4/2007 | Iftime et al. |
| 7,214,456 | B2 | 5/2007 | Iftime et al. |
| 7,229,740 | B2 | 6/2007 | Iftime et al. |
| 7,256,921 | B2 | 8/2007 | Kumar et al. |
| 7,332,257 | B2 | 2/2008 | Miyako et al. |
| 7,381,506 | B2 | 6/2008 | Iftime et al. |
| 7,441,887 | B2 | 10/2008 | Senga et al. |
| 2002/0160318 | A1 | 10/2002 | Richter et al. |
| 2003/0130456 | A1 | 7/2003 | Kim et al. |
| 2005/0012998 | A1* | 1/2005 | Kumar et al. ............... 359/494 |
| 2005/0244744 | A1 | 11/2005 | Kazmaier et al. |
| 2005/0269556 | A1 | 12/2005 | Evans et al. |
| 2006/0001944 | A1 | 1/2006 | Chopra et al. |
| 2006/0222972 | A1 | 10/2006 | Chopra et al. |
| 2006/0222973 | A1 | 10/2006 | Iftime et al. |
| 2006/0236470 | A1 | 10/2006 | Sabnis et al. |
| 2006/0251988 | A1 | 11/2006 | Iftime et al. |
| 2006/0257785 | A1 | 11/2006 | Johnson |
| 2007/0054215 | A1 | 3/2007 | Iftime et al. |
| 2007/0072110 | A1 | 3/2007 | Iftime et al. |
| 2007/0112103 | A1 | 5/2007 | Zhou et al. |

FOREIGN PATENT DOCUMENTS

| CA | 2 053 094 A1 | 4/1992 |
| EP | 1 367 111 | 12/2003 |
| EP | 1 405 891 | 4/2004 |
| EP | 1 591 829 | 11/2005 |
| EP | 1 591 831 | 11/2005 |
| FR | 2774998 | 8/1999 |
| GB | 2 430 257 | 3/2007 |
| JP | 57-136645 | 8/1982 |
| JP | A-61-175087 | 8/1986 |
| JP | A-5-265129 | 10/1993 |
| JP | A-11-30835 | 2/1999 |
| JP | A-2002-240441 | 8/2002 |
| JP | A-2002-285146 | 10/2002 |
| JP | A-2003-255489 | 9/2003 |
| JP | A-2003-255490 | 9/2003 |
| JP | A-2004-039009 | 2/2004 |
| JP | A-2004-045037 | 2/2004 |
| JP | A-2004-091638 | 3/2004 |
| JP | A-2004-149501 | 5/2004 |
| JP | A-2004-256780 | 9/2004 |
| JP | A-2005-082507 | 3/2005 |
| JP | A-2005-250463 | 9/2005 |
| WO | WO 97/31033 | 8/1997 |
| WO | WO 00/016985 A1 | 3/2000 |
| WO | WO 2006/039130 A1 | 4/2006 |
| WO | WO 2008/043853 A2 | 4/2008 |

OTHER PUBLICATIONS

Masamitsu Shirai et al., "Photoacid and Photobase Generators: Chemistry and Applications to Polymeric Materials," *Prog. Polym. Sci.* vol. 21, pp. 1-45 (1996).

(Continued)

*Primary Examiner*—Amanda C. Walke
(74) *Attorney, Agent, or Firm*—Oliff & Berridge, Plc.

(57) ABSTRACT

An image forming medium includes a substrate and an imaging layer coated on or impregnated into the substrate, where the imaging layer includes a photobase generator and a coupling agent. In the image forming medium, irradiation of the imaging layer cause the photobase generator to generate a base that reacts with the coupling agent to produce an image.

24 Claims, No Drawings

OTHER PUBLICATIONS

U.S. Appl. No. 11/762,152, filed Jun. 13, 2007, to Iftime et al.
U.S. Appl. No. 11/762,327, filed Jun. 13, 2007, to Iftime et al.
U.S. Appl. No. 11/762,147, filed Jun. 13, 2007, to Iftime et al.
U.S. Appl. No. 11/762,098, filed Jun. 13, 2007, to Iftime et al.
U.S. Appl. No. 11/762,157, filed Jun. 13, 2007, to Iftime et al.
U.S. Appl. No. 11/762,153, filed Jun. 13, 2007, to Iftime et al.
U.S. Appl. No. 11/762,144, filed Jun. 13, 2007, to Kazmaier et al.
U.S. Appl. No. 11/762,150, filed Jun. 13, 2007, to Norsten et al.
U.S. Appl. No. 11/762,107, filed Jun. 13, 2007, to Iftime et al.
U.S. Appl. No. 11/762,176, filed Jun. 13, 2007, to Norsten et al.
U.S. Appl. No. 11/762,307, filed June 13, 2007, to Norsten et al.
U.S. Appl. No. 11/762,159, filed Jun. 13, 2007, to Kazmaier et al.
U.S. Appl. No. 11/762,311, filed Jun. 13, 2007, to Kazmaier et al.
M. Irie, "Diarylethense for Memories and Switches," Chem Reviews, 100, pp. 1685-1716 (2000).
Kentaro Morimitsu et al., "Dithienylethenes With a Novel Photochromic Performance," J. Org. Chem., vol. 67, pp. 4574-4578 (2002).
Wojtyk et al., "Effects of metal ion complexation on the spiropyran-merocyanine interconversion: development of a thermally stable photo-switch," J. Chem. Soc. Chem, Comm., pp. 1703-1704, 1998.
"Dolch Introduces World's First Ruggedized Notebook with Integrated Printer" available at http://news.thomasnet.com/fullstory/7005/447, pp. 1-4, Feb. 6, 2002.
T. Hirose et al., "Self-Assembly of Photochromic Diarylethenes With Amphiphilic Side Chains: Reversible Thermal and Photochemical Control," J. Org. Chem., 71, pp. 7499-7508 (2006).
T. Norsten et al., "Photoregulation of Fluorescence in a Porphyrinic Dithienylethene Photochrome," J. Am. Chem. Soc., 123(8), pp. 1784-1785 (2001).

Vladimir I. Minkin, "Photo-, Thermo-, Solvato-, and Electrochromic Spiroheterocyclic Compounds," Chemical Reviews, 104, 5, pp. 2751-2776 (2004).
Takayuki Suzuki et al., "Stabilization of the merocyanine form of photochromic compounds in fluoro alcohols is due to a hydrogen bond", Chem. Commun., 2685-2686 (1998).
Ronald F.M. Lange et al., "Supramolecular polymer interactions based on the alternating copolymer of styrene and Maleimide" Macromolecules, 28, 782-783 (1995).
Vladimir I. Minkin et al., "Perimidine spirocyclohexa dienones" in Organic Photochromic and Thermochromic Compounds, VI, Plenum Press, pp. 315-340 (1999).
John Biteau et al., "Photochromism of Spirooxazine-Doped Gels," J. Phys. Chem., 100, 9024-9031 (1996).
Leonard J. Prins et al., "Noncovalent Synthesis Using Hydrogen Bonding," Angew. Chem. Int. Ed., 40, 2382-2426 (2001).
Terry M. Cresp et al., "A Synthesis of $\alpha\beta$-Unsaturated Aldehydes," J. Chem. Soc., Perkin Trans., 1, pp. 37-41 (1974).
Elliot Berman et al., "Photochromic Spiropyrans. I. The Effect of Substituents on the Rate of Ring Closure," J. Am. Chem. Soc., 81, 5605-5608 (1959).
Sheng-Hua Liu et al., "Synthesis of Negative Photochromic Crowned Spirobenzopyrans," Syn. Commun., 30, 5, 895-902 (2000).
Yu M. Chunaev et al., "Reaction of the Fischer Base With Nitro- and Bromo-Substituted αHydroxycinnamaldehydes," Chem. Heterocycl. Compd., 628-631(1984).
Kentaro Morimitsu et al., "Thermal Cycloreversion Reaction of a Photochromic Dithienylperfluorocyclopentene with *tert*-Butoxy Substituents at the Reactive Carbons," The Chemical Society of Japan, 2002, p. 572-573.

* cited by examiner

INKLESS REIMAGEABLE PRINTING PAPER AND METHOD

TECHNICAL FIELD

This disclosure is generally directed to a substrate, method, and apparatus for inkless printing on reimageable paper. More particularly, in embodiments, this disclosure is directed to an inkless reimageable printing substrates, such as inkless printing paper utilizing a composition that is imageable and eraseable by UV light, such as comprising a photobase generator, a coupling agent, and a photoacid generator, which composition can be dispersed in a polymer as a dry coating onto or into the substrate. The imaged UV light of a first wavelength causes the photobase generator to generate a base, such as an amine, which in turn reacts with the coupling agent, such as an aldehyde, to produce an extended conjugation that forms a colored image. The imaged UV light of a second wavelength then causes the photoacid generator to generate an acid, which in turn reacts with the extended conjugation to erase the colored image. Other embodiments are directed to inkless printing methods using the inkless printing substrates, and apparatus and systems for such printing.

CROSS-REFERENCE TO RELATED APPLICATIONS

Disclosed in commonly assigned U.S. patent application Ser. No. 11/123,163, filed May 6, 2005, is an image forming medium, comprising a polymer, a photochromic compound containing chelating groups embedded in the polymer, and a metal salt, wherein molecules of the photochromic compound are chelated by a metal ion from the metal salt.

Disclosed in commonly assigned U.S. patent application Ser. No. 10/835,518, filed Apr. 29, 2004, is an image forming method comprising: (a) providing a reimageable medium comprised of a substrate and a photochromic material, wherein the medium is capable of exhibiting a color contrast and an absence of the color contrast; (b) exposing the medium to an imaging light corresponding to a predetermined image to result in an exposed region and a non-exposed region, wherein the color contrast is present between the exposed region and the non-exposed region to allow a temporary image corresponding to the predetermined image to be visible for a visible time; (c) subjecting the temporary image to an indoor ambient condition for an image erasing time to change the color contrast to the absence of the color contrast to erase the temporary image without using an image erasure device; and (d) optionally repeating procedures (b) and (c) a number of times to result in the medium undergoing a number of additional cycles of temporary image formation and temporary image erasure.

Disclosed in commonly assigned U.S. patent application Ser. No. 10/834,722, filed Apr. 29, 2004, is a reimageable medium comprising: a substrate; and a photochromic material, wherein the medium is capable of exhibiting a color contrast and an absence of the color contrast, wherein the medium has a characteristic that when the medium exhibits the absence of the color contrast and is then exposed to an imaging light corresponding to a predetermined image to result in an exposed region and a non-exposed region, the color contrast is present between the exposed region and the non-exposed region to form a temporary image corresponding to the predetermined image that is visible for a visible time, wherein the medium has a characteristic that when the temporary image is exposed to an indoor ambient condition for an image erasing time, the color contrast changes to the absence of the color contrast to erase the temporary image in all of the following: (i) when the indoor ambient condition includes darkness at ambient temperature, (ii) when the indoor ambient condition includes indoor ambient light at ambient temperature, and (iii) when the indoor ambient condition includes both the darkness at ambient temperature and the indoor ambient light at ambient temperature, and wherein the medium is capable of undergoing multiple cycles of temporary image formation and temporary image erasure.

Disclosed in commonly assigned U.S. patent application Ser. No. 11/220,803, filed Sep. 8, 2005, is an image forming medium, comprising: a substrate; and an imaging layer comprising a photochromic material and a polymer binder coated on said substrate, wherein the photochromic material exhibits a reversible homogeneous-heterogeneous transition between a colorless state and a colored state in the polymer binder.

Disclosed in commonly assigned U.S. patent application Ser. No. 11/220,572, filed Sep. 8, 2005, is an image forming medium, comprising: a substrate; and a mixture comprising a photochromic material and a solvent wherein said mixture is coated on said substrate, wherein the photochromic material exhibits a reversible homogeneous-heterogeneous transition between a colorless state and a colored state in the solvent.

Disclosed in commonly assigned U.S. patent application Ser. No. 11/123,163, filed May 6, 2005, is an image forming medium, comprising a polymer; and a photochromic compound containing chelating groups embedded in the polymer; and a metal salt; wherein molecules of the photochromic compound are chelated by a metal ion from the metal salt.

Disclosed in commonly assigned U.S. patent application Ser. No. 11/093,993, filed Mar. 20, 2005, is a reimageable medium, comprising: a substrate having a first color; a photochromic layer adjacent to the substrate; a liquid crystal layer adjacent to the photochromic layer, wherein the liquid crystal layer includes a liquid crystal composition; and an electric field generating apparatus connected across the liquid crystal layer, wherein the electric field generating apparatus supplies a voltage across the liquid crystal layer.

Disclosed in commonly assigned U.S. patent application Ser. No. 10/834,529, filed Apr. 29, 2004, is a reimageable medium for receiving an imaging light having a predetermined wavelength scope, the medium comprising: a substrate; a photochromic material capable of reversibly converting among a number of different forms, wherein one form has an absorption spectrum that overlaps with the predetermined wavelength scope; and a light absorbing material exhibiting a light absorption band with an absorption peak, wherein the light absorption band overlaps with the absorption spectrum of the one form.

The entire disclosure of the above-mentioned applications are totally incorporated herein by reference.

BACKGROUND

Inkjet printing is a well-established market and process, where images are formed by ejecting droplets of ink in an image-wise manner onto a substrate. Inkjet printers are widely used in home and business environments, and particularly in home environments due to the low cost of the inkjet printers. The inkjet printers generally allow for producing high quality images, ranging from black-and-white text to photographic images, on a ride range of substrates such as standard office paper, transparencies, and photographic paper.

However, despite the low printer costs, the cost of replacement inkjet cartridges can be high, and sometimes higher than the cost of the printer itself. These cartridges must be replaced frequently, and thus replacement costs of the ink cartridges is a primary consumer complaint relating to inkjet printing. Reducing ink cartridge replacement costs would thus be a significant enhancement to inkjet printing users.

In addition, many paper documents are promptly discarded after being read. Although paper is inexpensive, the quantity of discarded paper documents is enormous and the disposal of these discarded paper documents raises significant cost and environmental issues. Accordingly, there is a continuing desire for providing a new medium for containing the desired image, and methods for preparing and using such a medium. In aspects thereof it would be desirable to be reusable, to abate the cost and environmental issues, and desirably also is flexible and paper-like to provide a medium that is customarily acceptable to end-users and easy to use and store.

Although there are available technologies for transient image formation and storage, they generally provide less than desirable results for most applications as a paper substitute. For example, alternative technologies include liquid crystal displays, electrophoretics, and gyricon image media. However, these alternative technologies may not in a number of instances provide a document that has the appearance and feel of traditional paper, while providing the desired reimageability.

Imaging techniques employing photochromic materials, that is materials which undergo reversible or irreversible photoinduced color changes are known, for example, U.S. Pat. No. 3,961,948 discloses an imaging method based upon visible light induced changes in a photochromic imaging layer containing a dispersion of at least one photochromic material in an organic film forming binder.

These and other photochromic (or reimageable or electric) papers are desirable because they can provide imaging media that can be reused many times, to transiently store images and documents. For example, applications for photochromic based media include reimageable documents such as, for example, electronic paper documents. Reimageable documents allow information to be kept for as long as the user wants, then the information can be erased or the reimageable document can be re-imaged using an imaging system with different information.

Although the above-described approaches have provided reimageable transient documents, there is a desire for reimageable paper designs that provide longer image life-times, and more desirable paper-like appearance and feel. For example, while the known approaches for photochromic paper provide transient visible images, the visible images are very susceptible to UV light, such as is present in both ambient interior light and more especially in sun light. Due to the presence of this UV light, the visible images are susceptible to degradation by the UV light, causing the unimaged areas to darken and thereby decrease the contrast between the desired image and the background or unimaged areas.

That is, a problem associated with transient documents is the sensitivity of the unimaged areas to ambient UV-VIS light (such as <420 nm) where the photochromic molecule absorbs. Unimaged areas become colored after a period of time, decreasing the visual quality of the document, because the contrast between white and colored state is reduced. One approach, described in the above-referenced U.S. patent application Ser. No. 10/834,529, is to stabilize the image against light of wavelength <420 nm by creating a band-pass window for the incident light capable of isomerising (i.e. inducing coloration) in the material, centered around 365 nm. However, the unimaged areas of the documents still are sensitive to UV-VIS light of wavelength centered around 365 nm.

SUMMARY

It is desirable for some uses that an image formed on a reimageable medium such as a transient document remains stable for extended time periods, without the image or image contrast being degraded by exposure to ambient UV light. However, it is also desired that the image can be erased when desired, to permit reimaging of the medium. Electronic paper documents should maintain a written image for as long as the user needs to view it, without the image being degraded by ambient light. The image may then be erased or replaced with a different image by the user on command.

The present disclosure addresses these and other needs, in embodiments, by providing a reimageable image forming medium utilizing a composition that is both imageable and eraseable by UV light, and which comprises a photobase generator, a coupling agent, and a photoacid generator, which composition can be dispersed in a polymer as a dry coating onto or into the substrate. The imaged UV light of a first wavelength causes the photobase generator to generate a base, such as an amine, which in turn reacts with the coupling agent, such as an aldehyde, to produce an extended conjugation that forms a colored image. For erasing, imaged UV light of a second wavelength causes the photoacid generator to generate an acid, which in turn reacts with the extended conjugation to erase the colored image. The present disclosure in other embodiments provides an inkless printing methods using the reimageable inkless printing substrates, and apparatus and systems for such printing.

The present disclosure thereby provides a printing media, method, and printer system for printing images without using ink or toner. The paper media has a special imageable composition and it is printed and can be erased with UV light. The paper media thus allows image formation and erasure using a printer that does not require ink or toner replacement, and instead images the paper using a UV light source, such as a LED.

In an embodiment, the present disclosure provides a reimageable image forming medium, comprising
 a substrate; and
 an imaging layer coated on or impregnated into said substrate, wherein the imaging layer comprises:
  a photobase generator,
  a coupling agent, and
  a photoacid generator,
 wherein irradiation of the imaging layer with light of a first wavelength causes said photobase generator to generate a base that reacts with the coupling agent to produce an extended conjugation that forms an image, and irradiation of the imaging layer with light of a second wavelength causes said photoacid generator to generate an acid that reacts with the extended conjugation to reverse formation of the extended conjugation to erase the image.

In another embodiment, the present disclosure provides a method of making a reimageable image forming medium, comprising applying an imaging layer composition to a substrate, wherein the imaging layer composition comprises:
 a photobase generator,
 a coupling agent, and
 a photoacid generator,
 wherein irradiation of the imaging layer with light of a first wavelength causes said photobase generator to generate a base that reacts with the coupling agent to produce an extended conjugation that forms an image, and irradiation of the imaging layer with light of a second wavelength causes said photoacid generator to generate an acid that reacts with the extended conjugation to reverse formation of the extended conjugation to erase the image.

In another aspect, the present disclosure provides a method of forming an image, comprising:
 providing an image forming medium comprising:
  a substrate; and
  an imaging layer coated on or impregnated into said substrate, wherein the imaging layer comprises a photobase generator, a coupling agent, and a photoacid generator;

exposing the image forming medium to UV irradiation of a first wavelength in an imagewise manner, wherein said UV irradiation causes said photobase generator to generate a base that reacts with the coupling agent to produce an extended conjugation that forms an image.

The imaging method can be conducted, for example, using an imaging system, comprising:

the image forming medium described above; and a printer comprising a UV irradiation source for printing on the image forming medium in an imagewise manner.

DETAILED DESCRIPTION OF EXEMPLARY EMBODIMENTS

Generally, in various exemplary embodiments, there is provided an inkless reimageable paper or image forming medium formed using a composition that is imageable and eraseable by UV light, such as comprising a photobase generator, a coupling agent, and a photoacid generator, which composition can be dispersed in a polymer as a dry coating onto or into the substrate. The imaged UV light of a first wavelength causes the photobase generator to generate a base, such as an amine, which in turn reacts with the coupling agent, such as an aldehyde, to produce an extended conjugation that forms a colored image. For erasing, imaged UV light of a second wavelength causes the photoacid generator to generate an acid, which in turn reacts with the extended conjugation to erase the colored image. The composition thus exhibits a reversible transition between a clear state and a colored state in the image forming medium. By a colored state, in embodiments, refers to for example, the presence of visible wavelengths; likewise, by a colorless state, in embodiments, refers to for example, the complete or substantial absence of visible wavelengths.

In embodiments, the image forming medium generally comprises an imaging layer coated on or impregnated in a suitable substrate material, or sandwiched between a first and a second substrate material (i.e., a substrate material and an overcoat layer).

The imaging layer can include any suitable first material that, when exposed to an activating energy such as ultraviolet light of a first wavelength, switches from a first clear state to a second colored state, and any suitable second material that, when exposed to an activating energy such as ultraviolet light of a second wavelength, switches from the second colored state back to the first clear state. The color state change in embodiments is reversible, and thus the image can be "erased" and the image forming medium returned to a blank state.

In embodiments, any suitable composition can be used for forming the imaging layer. For example, the imaging layer can comprise a photobase generator, a coupling agent, and a photoacid generator, which composition can be dispersed in a polymer as a dry coating onto or into the substrate. In this composition, the imaged UV light causes the photobase generator to generate a base, such as an amine, which in turn reacts with the coupling agent, such as an aldehyde, to produce an extended conjugation that forms a colored image. The imaged UV light of a second wavelength then causes the photoacid generator to generate an acid, which in turn reacts with the extended conjugation to erase the colored image. The active imaging materials can be dispersed in any suitable medium for forming the imaging layer, such as being dispersed in a solvent, a solution, a polymer binder, or the like; being chemically bonded to a carrier such as a polymer binder; provided in the form of microencapsulated materials; incorporated in an enclosed matrix to hold the imaging composition in place; and the like. In embodiments, the image forming reaction can be reversible a limited number of times, due to small quantities of the imaging materials being consumed each time the image state is changed.

Any suitable photobase generator can be used, where the photobase generator is a precursor that generates a base, such as an amine, when exposed to the activating energy such as UV light. In embodiments, the photobase generator produces an amine when exposed to UV light, where the amine is a basic compound having a pH>7.

Various suitable photobase generators are known in the art, and can be used in embodiments herein. Exemplary photobase generators include o-acyloximes, benzoyloxycarbonyl derivatives, photoactive carbamates such as benzyl carbamates and benzoin carbamates, oxime ester compounds like o-carbamoyloximes, ammonium compounds like quaternary ammonium tetraphenyl borate salts, benzoin compounds, dimethoxybenzyl urethane compounds, orthonitrobenzyl urethane compounds, aromatic sulfonamides, alpha-lactams, N-(2-arylethenyl)amides, mixtures thereof, and the like. These compounds generally generate amines as bases by being irradiated with an active energy beam such as UV light. A further review of photoacid and photobase generators can be found, for example, in Prog. Polym. Sci. vol. 21, 1-45, 1996, the entire disclosure of which is incorporated herein by reference.

By way of example only, specific suitable organic based photobase generators include, 2-hydroxy-2-phenylacetophenone N-cyclohexyl carbamate (i.e., $C_6H_5C(=O)CH(C_6H_5)OC(=O)NHC_6H_{11}$); o-nitrobenzyl N-cyclohexyl carbamate (i.e., $o\text{-}NO_2C_6H_5CH_2C(=O)NHC_6H_{11}$); N-cyclohexyl-2-naphthalene sulfonamide (i.e., $C_{10}H_7SO_2NHC_6H_{11}$); 3,5-dimethoxybenzyl N-cyclohexyl carbamate (i.e., $(CH_3O)_2C_6H_5CH_2C(=O)NHC_6H_{11}$); N-cyclohexyl p-toluene sulfonamide (i.e., $p\text{-}CH_3C_6H_5SO_2NHC_6H_{11}$); and dibenzoin isophorone dicarbamate.

An illustrative example of a suitable photobase generator (amine photogeneration) is shown below:

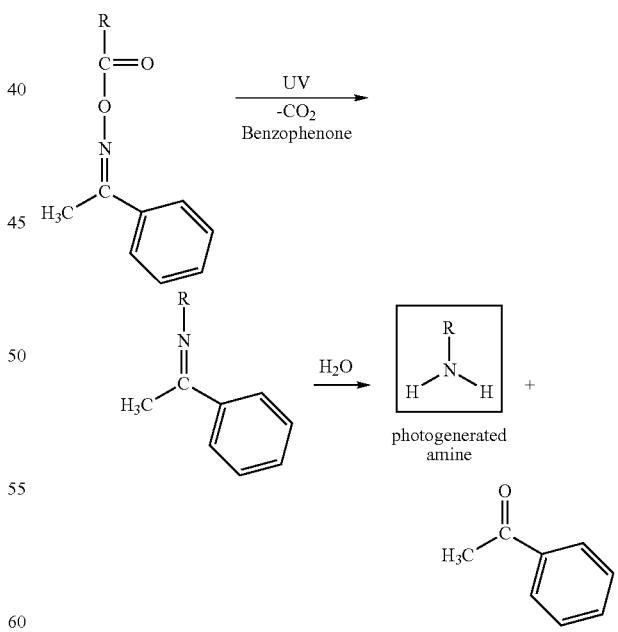

In this depicted process, described in polystyrene films, benzophenone acts as a sensitizer. Water is present in the ambient conditions.

In addition, a suitable photosensitizer may optionally be used in combination with the photobase generator to expand the photosensitize wavelength band of the active energy beam of the photobase generator. Various photosensitizers are well known in the art, and can be used in embodiments. Examples of the photosensitizers include benzophenone, and the like. However, in embodiments, a photosensitizer is desirably omitted, to provide a narrow wavelength band of the active energy beam to help prevent accidental activation of the imaging materials.

Any suitable coupling agent can also be used, where the coupling agent reacts with the base generated from the photobase generator to produce an extended conjugation to produce a colored image, and the extended conjugation can in turn react with an acid generated from the photoacid generator to reverse the reaction to form a colorless image erasing the colored image. In embodiments, the reaction of the coupling agent with the base generated from the photobase generator causes the image forming layer at the reaction site to change from a clear or colorless state to a colored state, with the degree and/or color of the change being related to the type of materials reacting and the relative amount of material reacting. Likewise, the reaction of the extended conjugation with the acid generated from the photoacid generator causes the image forming layer at the reaction site to change from the colored state to the clear or colorless state, with the degree and/or color of the change being related to the type of materials reacting and the relative amount of material reacting.

Various suitable coupling agents are known in the art, and can be used in embodiments herein. For example, suitable coupling agents are those that can react with the colorless base generated from the photobase generator to form a colored extended conjugation or Schiff base compound, and where the resultant extended conjugation or Schiff base compound can in turn react with an acid generated from the photoacid generator to reverse the reaction to form a colorless image thereby erasing the colored image. These reactions are shown in an exemplary manner as follows:

heliotropin, hydroxycitronellal, koavone, lauric aldehyde, lyral, methyl nonyl acetaldehyde, P. T. bucinal, phenyl acetaldehyde, undecylenic aldehyde, vanillin, 2,6,10-trimethyl-9-undecenal, 3-dodecen-1-al, alpha-n-amyl cinnamic aldehyde, 4-methoxybenzaldehyde, benzaldehyde, 3-(4-tert butylphenyl)-propanal, 2-methyl-3-(para-methoxyphenyl propanal, 2-methyl-4-(2,6,6-trimethyl-2(1)-cyclohexen-1-yl)butanal, 3-phenyl-2-propenal, cis-/trans-3,7-dimethyl-2, 6-octadien-1-al, 3,7-dimethyl-6-octen-1-al, [(3,7-dimethyl-6-octenyl)oxy]acetaldehyde, 4-isopropylbenzyaldehyde, 1,2,3,4,5,6,7,8-octahydro-8,8-dimethyl-2-naphthaldehyde, 2,4-dimethyl-3-cyclohexen-1-carboxaldehyde, 2-methyl-3-(isopropylphenyl)propanal, 1-decanal, decyl aldehyde, 2,6-dimethyl-5-heptenal, 4-(tricyclo[5.2.1.0(2,6)]-decylidene-8)-butanal, octahydro-4,7-methano-1H-indenecarboxaldehyde, 3-ethoxy4-hydroxy benzaldehyde, para-ethyl-alpha, alpha-dimethyl hydrocinnamaldehyde, alpha-methyl-3,4-(methylenedioxy)-hydrocinnamaldehyde, 3,4-methylenedioxybenzaldehyde, alpha-n-hexyl cinnamic aldehyde, m-cymene-7-carboxaldehyde, alpha-methyl phenyl acetaldehyde, 7-hydroxy-3,7-dimethyl octanal, Undecenal, 2,4,6-trimethyl-3-cyclohexene-1-carboxaldehyde, 4-(3) (4-methyl-3-pentenyl)-3-cyclohexen-carboxaldehyde, 1-dodecanal, 2,4-dimethyl cyclohexene-3-carboxaldehyde, 4-(4-hydroxy-4-methyl pentyl)-3-cylohexene-1-carboxaldehyde, 7-methoxy-3,7-dimethyloctan-1-al, 2-methyl undecanal, 2-methyl decanal, 1-nonanal, 1-octanal, 2,6,10-trimethyl-5,9-undecadienal, 2-methyl-3-(4-tertbutyl)propanal, dihydrocinnamic aldehyde, 1-methyl-4-(4-methyl-3-pentenyl)-3-cyclohexene-1-carboxaldehyde, 5 or 6 methoxy0hexahydro4,7-methanoindan-1 or 2-carboxaldehyde, 3,7-dimethyloctan-1-al, 1-undecanal, 10-undecen-1-al, 4-hydroxy-3-methoxy benzaldehyde, 1-methyl-3-(4-methylpentyl)-3-cyclohexenecarboxaldehyde, 7-hydroxy-3,7-

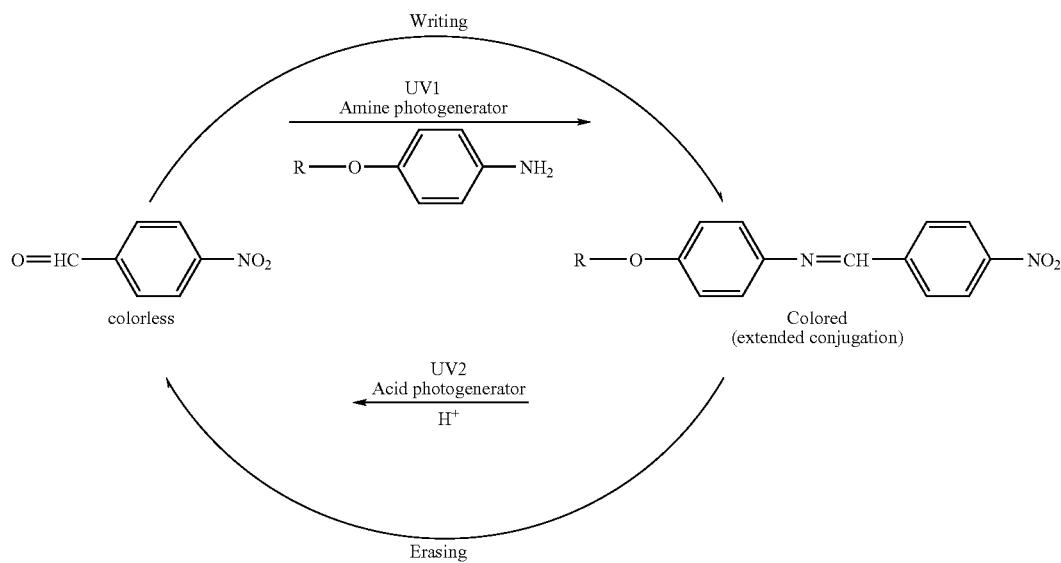

In general, any coupling agent that produces a significant enough color change upon reaction with the generated base, and which reaction and color change is reversible upon reaction with the generated acid, is suitable. Exemplary coupling agents include aldehydes, ketones, and mixtures thereof. For example, suitable aldehydes that can be used include adoxal, anisic aldehyde, cymal, ethyl vanillin, florhydral, helional, dimethyl-octanal, trans-4-decenal, 2,6-nonadienal, para-tolylacetaldehyde, 4-methylphenylacetaldehyde, 2-methyl-4-(2,6,6-trimethyl-1-cyclohexen-1-yl)-2-butenal, ortho-methoxycinnamic aldehyde, 3,5,6-trimethyl-3-cyclohexene carboxaldehyde, 3,7-dimethyl-2-methylene-6-octenal, phenoxyacetaldehyde, 5,9-dimethyl-4,8-decadienal, peony aldehyde(6,10-dimethyl-3-oxa-5,9-undecadien-1-al), hexahydro-4,7-methanoindan-1-carboxaldehyde, 2-methyl octanal, alpha-methyl-4-(1-methyl ethyl)benzene acetaldehyde, 6,6-dimethyl-2-norpinene-2-propionaldehyde, para methyl phenoxy acetaldehyde, 2-methyl-3-phenyl-2-propen-1-al, 3,5,5-trimethyl hexanal, Hexahydro-8,8-dimethyl-2-naphthaldehyde, 3-propyl-bicyclo[2.2.1]-hept-5-ene-2-carbaldehyde, 9-decenal, 3-methyl-5-phenyl-1-pentanal, methylnonyl acetaldehyde, 1-p-menthene-q-carboxaldehyde, citral, lilial, florhydral, mefloral, and mixtures thereof. Other examples include aromatic aldehydes, such as like 4-nitro-bezaldehyde, 2-nitro-benzalhyede, 4-methoxybenzaldhyed etc.

Suitable ketones, including aliphatic ketones, cyclic ketones, aromatic ketones, and the like that can be used include buccoxime, iso jasmine, methyl beta naphthyl ketone, musk indanone, tonalid/musk plus, Alpha-Damascone, Beta-Damascone, Delta-Damascone, Iso-Damascone, Damascenone, Damarose, Methyl-Dihydrojasmonate, Menthone, Carvone, Camphor, Fenchone, Alpha-Ionone, Beta-Ionone, Gamma-Methyl so-called Ionone, Fleuramone, Dihydrojasmone, Cis-Jasmone, Iso-E-Super, Methyl-Cedrenyl-ketone or Methyl-Cedrylone, Acetophenone, Methyl-Acetophenone, Para-Methoxy-Acetophenone, Methyl-Beta-Naphtyl-Ketone, Benzyl-Acetone, Benzophenone, Para-Hydroxy-Phenyl-Butanone, Celery Ketone or Livescone, 6-Isopropyldecahydro-2-naphtone, Dimethyl-Octenone, Freskomenthe, 4-(1-Ethoxyvinyl)-3,3,5,5,-tetramethyl-Cyclohexanone, Methyl-Heptenone, 2-(2-(4-Methyl-3-cyclohexen-1-yl)propyl)-cyclopentanone, 1-(p-Menthen-6(2)-yl)-1-propanone, 4-(4-Hydroxy-3-methoxyphenyl)-2-butanone, 2-Acetyl-3,3-Dimethyl-Norbornane, 6,7-Dihydro-1,1,2,3,3-Pentamethyl-4(5H)-Indanone, 4-Damascol, Dulcinyl or Cassione, Gelsone, Hexylon, Isocyclemone E, Methyl Cyclocitrone, Methyl-Lavender-Ketone, Orivon, Para-tertiary-Butyl-Cyclohexanone, Verdone, Delphone, Muscone, Neobutenone, Plicatone, Veloutone, 2,4,4,7-Tetramethyl-oct-6-en-3-one, Tetrameran, hedione, 1,4-benzoquinone and substituted derivatives, like 2-cholor-1,4-benzoquinone, 1,2-benzoquinone and its substituted derivatives, diaryl-ketones like benzophenone derivatives, alkyl-aryl ketones like acetophenone and derivatives, optionally having electron withdrawing or electron donating functional groups and mixtures thereof. Other suitable aromatic ketones include acetophenone, ethyl phenyl ketone, and diphenyl ketone, benzophenone, 2,2-dimethoxy-2-phenylacetophenone, dimethoxyacetophenone, xanthone, thioxanthone, p-methylacetophenone, propiophenone, 1-phenyl-1-butanone, isopropylphenylketone, benzaldehyde, o-hydroxybenzaldehyde, m-hydroxybenzaldehyde, p-hydroxybenzaldehyde, benzylmethylketone, their derivatives, and mixtures thereof. Also suitable for use may be cyclic ketones, such as cyclobutanone, cyclopentanone, cyclohexanone, heptanone, methylcyclohexanone, cyclooctanone, cyclononanone, cyclodecanone, cycloundecanone, cyclododecanone, cyclotridecanone, and the like.

Because water is generated as a by-product in the reaction between the base and the coupling agent, heat can be applied to the imaged print substrate to remove the formed water.

It will be appreciated that with the suitable selection of coupling agent or a mixture of coupling agents, it is possible to produce any color in the image forming medium. For example, suitable coupling agents can be selected to provide colors ranging from yellow, to red, to blue, to cyan, to purple. Furthermore, combinations of two or more coupling agents may be used to provide a wider range of colors. For example, black or full color images can be provided by selecting combinations of coloring agents that provide cyan, magenta, and yellow colors.

Any suitable photoacid generator can be used, where the photoacid generator is a precursor that generates an acid when exposed to the activating energy such as UV light. In embodiments, the photoacid generator produces a hydrogen ion when exposed to UV light.

Various suitable photoacid generators are known in the art, such as for photoresist etching in the microelectronic industry and as catalysts for photoinitiated cationic polymerization reactions, and can be used in embodiments herein. Exemplary general classes of photoacid generators include ionic photoacid generators as well as non-ionic photoacid generators. More specifically, exemplary photoacid generators include aryldiazonium salts, diaryl halonium salts, triaryl sulfonic salts, aryl sulfonium salts, aryl iodonium salts, nitrobenzyl compounds such as nitrobenzyl esters, acetophenone derivative compounds such as sulfonyl acetophenones, sulfones, phosphates, diazomethane compounds, onium salt compounds, sulfonimide compounds, disulfone compounds, sulfonic acid derivative compounds, benzoin tosylate compounds. iron arene complexes, halogen-containing triazine compounds, and cyano-containing oxim sulfonate compounds, and the like.

By way of example only, specific suitable photoacid generators include, diphenyliodonium chloride, diphenyliodonium trifluoromethane sulfonate, diphenyliodonium mesylate, diphenyliodonium tosylate, diphenyliodonium bromide, diphenyliodonium tetrafluoroborate, diphenyliodonium hexafluoroantimonate, diphenyliodonium hexafluoroarsenate, bis(p-tert-butylphenyl)iodonium hexafluorophosphate, bis(p-tert-butylphenyl)iodonium mesylate, bis(p-tert-butylphenyl)iodonium tosylate, bis(p-tert-butylphenyl)iodonium trifluoromethane sulfonate, bis(p-tert-butylphenyl)iodonium tetrafluoroborate, bis(p-tert-butylphenyl)iodonium chloride, bis(p-chlorophenyl)iodonium chloride, bis(p-chlorophenyl)iodonium tetrafluoroborate, triphenylsulfonium chloride, triphenylsulfonium bromide, triphenylsulfonium trifluoromethane sulfonate, tri(p-methoxyphenyl)sulfonium tetrafluoroborate, tri(p-methoxyphenyl)sulfonium hexafluorophosphonate, tri(p-ethoxyphenyl)sulfonium tetrafluoroborate, triphenylphosphonium chloride, triphenylphosphonium bromide, tri(p-methoxyphenyl)phosphonium tetrafluoroborate, tri(p-methoxyphenyl)phosphonium hexafluoro phosphonate, tri(p-ethoxyphenyl)phosphonium tetrafluoroborate, and the like. These compounds generally generate an acid, such as a hydrogen ion, by being irradiated with an active energy beam such as UV light.

In addition, as with the photobase generator, a suitable photosensitizer may optionally be used in combination with the photoacid generator to expand the photosensitize wavelength band of the active energy beam of the photoacid generator. Various photosensitizers are well known in the art, and can be used in embodiments. Examples of the photosensitizers include benzophenone, and the like. However, in embodiments, a photosensitizer is desirably omitted, to provide a narrow wavelength band of the active energy beam to help prevent accidental activation of the imaging materials.

Photobase generators, coupling agents, and photoacid generators are usually effective when present in small amounts in the image forming compositions of the disclosure, but their content is not particularly limited. For example, in embodiments, the photobase generators, coupling agents, and photoacid generators are each generally present in amounts of from about 0.01% to about 20% by weight, such as from about 0.5% to about 10% by weight or from about 0.8% to about 8% by weight, of the total dry weight of the composition (i.e., excluding any volatile solvents used for applying the composition). For example, where the materials are selected that the color changing reactions irreversibly consume some of the reactants over time, then the image forming composition may include greater amounts or greater concentrations of the respective materials; however, in embodiments where the materials are selected that the color changing reactions do not irreversibly consume some of the reactants over time, then the image forming composition may include lesser amounts or lesser concentrations of the respective materials.

The image forming materials (photobase generator, coupling agent, and photoacid generator) may be dispersed in any suitable carrier, such as solvent, polymer binder, or the like. Suitable solvents include, for example, straight chain aliphatic hydrocarbons, branched chain aliphatic hydrocarbons, and the like, such as where the straight or branched chain aliphatic hydrocarbons have from about 1 to about 30 carbon atoms. For example, a non-polar liquid of the ISOPAR™ series (manufactured by the Exxon Corporation) may be used as the solvent. These hydrocarbon liquids are considered narrow portions of isoparaffinic hydrocarbon fractions. For example, the boiling range of ISOPAR G™ is from about 157° C. to about 176° C.; ISOPAR H™ is from about 176° C. to about 191° C.; ISOPAR K™ is from about 177° C. to about 197° C.; ISOPAR L™ is from about 188° C. to about 206° C.; ISOPAR M™ is from about 207° C. to about 254° C.; and ISOPAR V™ is from about 254.4° C. to about 329.4° C. Other suitable solvent materials include, for example, the NORPAR™ series of liquids, which are compositions of n-paraffins available from Exxon Corporation, the SOLTROL™ series of liquids available from the Phillips Petroleum Company, and the SHELLSOL™ series of liquids available from the Shell Oil Company. Mixtures of one or more solvents, i.e., a solvent system, can also be used, if desired. In addition, more polar solvents can also be used, if desired. Examples of more polar solvents that may be used include halogenated and nonhalogenated solvents, such as tetrahydrofuran, trichloro- and tetrachloroethane, dichloromethane, chloroform, monochlorobenzene, toluene, xylenes, acetone, methanol, ethanol, xylenes, benzene, ethyl acetate, dimethylformamide, cyclohexanone, N-methyl acetamide and the like. The solvent may be composed of one, two, three or more different solvents. When two or more different solvents are present, each solvent may be present in an equal or unequal amount by weight ranging for example from about 5% to 90%, particularly from about 30% to about 50%, based on the weight of all solvents.

Both compositions dispersable in either organic polymers or waterborne polymers can be used, depending on the used components. For example, for waterborne compositions, polyvinylalcohol is a suitable application solvent, and polymethylmethacrylate is suitable for organic soluble compositions.

Suitable examples of polymeric binders include, but are not limited to, polyalkylacrylates like polymethyl methacrylate (PMMA), polycarbonates, polyethylenes, oxidized polyethylene, polypropylene, polyisobutylene, polystyrenes, poly (styrene)-co-(ethylene), polysulfones, polyethersulfones, polyarylsulfones, polyarylethers, polyolefins, polyacrylates, polyvinyl derivatives, cellulose derivatives, polyurethanes, polyamides, polyimides, polyesters, silicone resins, epoxy resins, polyvinyl alcohol, polyacrylic acid, and the like. Copolymer materials such as polystyrene-acrylonitrile, polyethylene-acrylate, vinylidenechloride-vinylchloride, vinylacetate-vinylidene chloride, styrene-alkyd resins, poly (methacrylic acid), poly[1-2-(hydroxyethyl)aziridine0], Poly (N-hydroxyethyl)ethyleneimine, poly(ethyleneimine), poly (N-acetyl)ethyleneimine, poly(acrylamide), poly allylamine, poly(sodium styrene sulfonate) are also examples of suitable binder materials. The copolymers may be block, random, or alternating copolymers. In some embodiments, polymethyl methacrylate or a polystyrene is the polymer binder, in terms of their cost and wide availability.

In embodiments, the imaging composition can be applied in one form, and dried to another form for use. Thus, for example, the imaging composition comprising photobase generator, coupling agent, photoacid generator, and polymer particles may be dissolved or dispersed in a solvent for application to or impregnation into a substrate, with the solvent being subsequently evaporated to form a dry layer.

In general, the imaging composition can include the carrier and imaging material in any suitable amounts, such as from about 5 to about 99.5 percent by weight carrier, such as from about 30 to about 70 percent by weight carrier, and from about 0.05 to about 50 percent by weight imaging material, such as from about 0.1 to about 5 percent imaging material by weight.

For applying the imaging layer to the image forming medium substrate, the image forming layer composition can be applied in any suitable manner. For example, the image forming layer composition can be mixed and applied with any suitable solvent or polymer binder, and subsequently hardened or dried to form a desired layer. Further, the image forming layer composition can be applied either as a separate distinct layer to the supporting substrate, or it can be applied so as to impregnate into the supporting substrate.

The image forming medium may comprise a supporting substrate, coated or impregnated on at least one side with the imaging layer. As desired, the substrate can be coated or impregnated on either only one side, or on both sides, with the imaging layer. When the imaging layer is coated or impregnated on both sides, or when higher visibility of the image is desired, an opaque layer may be included between the supporting substrate and the imaging layer(s) or on the opposite side of the supporting substrate from the coated imaging layer. Thus, for example, if a one-sided image forming medium is desired, the image forming medium may include a supporting substrate, coated or impregnated on one side with the imaging layer and coated on the other side with an opaque layer such as, for example, a white layer. Also, the image forming medium may include a supporting substrate, coated or impregnated on one side with the imaging layer and with an opaque layer between the substrate and the imaging layer. If a two-sided image forming medium is desired, then the image forming medium may include a supporting substrate, coated or impregnated on both sides with the imaging layer, and with at least one opaque layer interposed between the two coated imaging layers. Of course, an opaque supporting substrate, such as conventional paper, may be used in place of a separate supporting substrate and opaque layer, if desired.

Any suitable supporting substrate may be used. For example, suitable examples of supporting substrates include, but are not limited to, glass, ceramics, wood, plastics, paper, fabrics, textile products, polymeric films, inorganic substrates such as metals, and the like. The plastic may be for example a plastic film, such as polyethylene film, polyethylene terephthalate, polyethylene naphthalate, polystyrene, polycarbonate, polyethersulfone. The paper may be, for example, plain paper such as XEROX® 4024 paper, ruled notebook paper, bond paper, silica coated papers such as Sharp Company silica coated paper, Jujo paper, and the like. The substrate may be a single layer or multi-layer where each layer is the same or different material. In embodiments, the substrate has a thickness ranging for example from about 0.3 mm to about 5 mm, although smaller or greater thicknesses can be used, if desired.

When an opaque layer is used in the image forming medium, any suitable material may be used. For example, where a white paper-like appearance is desired, the opaque layer may be formed from a thin coating of titanium dioxide, or other suitable material like zinc oxide, inorganic carbonates, and the like. The opaque layer can have a thickness of, for example, from about 0.01 mm to about 10 mm, such as about 0.1 mm to about 5 mm, although other thicknesses can be used.

If desired, a further overcoating layer may also be applied over the applied imaging layer. The further overcoating layer may, for example, be applied to further adhere the underlying layer in place over the substrate, to provide wear resistance, to improve appearance and feel, and the like. The overcoating layer can be the same as or different from the substrate material, although in embodiments at least one of the overcoating layer and substrate layer is clear and transparent to permit visualization of the formed image. The overcoating layer can have a thickness of, for example, from about 0.01 mm to about 10 mm, such as about 0.1 mm to about 5 mm, although other thicknesses can be used. However, in embodiments, an overcoating layer is not used, so as to allow easy evaporation of water formed during the imaging step, in a post-imaging heating step.

In embodiments where the imaging material is coated on or impregnated into the substrate, the coating can be conducted by any suitable method available in the art, and the coating method is not particularly limited. For example, the imaging material can be coated on or impregnated into the substrate by dip coating the substrate into a solution of the imaging material composition followed by any necessary drying, or the substrate can be coated with the imaging composition to form a layer thereof. Similarly, the protective coating can be applied by similar methods.

In its method aspects, the present disclosure involves providing an image forming medium comprised of a substrate and an imaging layer comprising a photobase generator, a coupling agent, and a photoacid generator, which composition can be dispersed in a polymer as a dry coating onto or into the substrate. To provide separate writing and erasing processes, the photobase generator and photoacid generator are sensitive to UV light or other irradiation source, although the separate materials are desirably sensitive at different irradiation properties, such as different wavelengths, different energy intensities, or the like. Thus, for example, the imaging layer as a whole could be sensitive at a first UV wavelength that causes the photobase generator to generate a base for subsequent reaction without affecting the photoacid generator, while the imaging layer as a whole could be sensitive at a second, different UV wavelength that causes the photoacid generator to generate an acid for subsequent reaction without affecting the photobase generator.

For example, in one embodiment, the photobase generator and photoacid generator are selected to be sensitive to UV light at different wavelengths, such as wavelengths separated by at least about 10 nm, at least about 20 nm, at least about 30 nm, at least about 40 nm, or at least about 50 nm. Thus, for example, if the photobase is sensitive at a wavelength of about 360 nm, then the photoacid generator is desirably sensitive at a wavelength of less than about 350 nm or greater than about 370 nm. Of course, the relative separation of sensitization wavelengths can be dependent upon, for example, the relatively narrow wavelengths of the exposing apparatus. The imaged UV light of a first wavelength or parameter thus causes the photobase generator to generate a base, such as an amine, which in turn reacts with the coupling agent, such as an aldehyde, to produce an extended conjugation colored compound that forms a colored image; likewise, the imaged UV light of a second wavelength or parameter causes the photoacid generator to generate an acid, which in turn reacts with the extended conjugation colored compound to erase the colored image.

In a writing process, the image forming medium is exposed to an imaging light having an appropriate activating wavelength, such as a UV or visible light source such as a light emitting diode (LED), in an imagewise fashion. The imaging light supplies sufficient energy to the photobase generator to cause the photobase generator to generate a base, such as an amine, which in turn reacts with the coupling agent, such as an aldehyde, to produce a colored image at the imaging location. The amount of energy irradiated on a particular location of the image forming medium can affect the intensity or shade of color generated at that location. Thus, for example, a weaker intensity image can be formed by delivering a lesser amount of energy to the location and thus generating a lesser amount of base, while a stronger intensity image can be formed by delivering a greater amount of energy to the location and thus generating a greater amount of base. When suitable coupling agents are selected to provide a black or other colored image, the variation in the amount of energy irradiated on a particular location of the image forming medium can thus allow for formation of grayscale images, while selection of other suitable coupling agents can allow for formation of full color images.

The separate imaging lights used to form the transient image and erase the transient image may have any suitable predetermined wavelength scope such as, for example, a single wavelength or a band of wavelengths. In various exemplary embodiments, the imaging lights are ultraviolet (UV) lights having a single wavelength or a narrow band of wavelengths selected from the UV light wavelength range of about 200 nm to about 475 nm, such as a single wavelength at about 365 nm or a wavelength band of from about 360 nm to about 370 nm. For forming the image, as well as for erasing the image, the image forming medium may be exposed to the respective imaging or erasing light for a time period ranging from about 10 milliseconds to about 5 minutes, particularly from about 30 milliseconds to about 1 minute. The imaging and erasing light may have an intensity ranging from about 0.1 mW/cm$^2$ to about 100 mW/cm$^2$, particularly from about 0.5 mW/cm$^2$ to about 10 mW/cm$^2$. If desired or helpful, the print medium can be heated during before or the imaging process to assist in the desired color change reactions.

In various exemplary embodiments, imaging light corresponding to the predetermined image may be generated for example by a computer or a Light Emitting Diode (LED) array screen and the image is formed on the image forming medium by placing the medium on or in proximity to the LED screen for the desired period of time. In other exemplary embodiments, a UV Raster Output Scanner (ROS) may be used to generate the UV light in an image-wise pattern. This embodiment is particularly applicable, for example, to a printer device that can be driven by a computer to generate printed images in an otherwise conventional fashion. That is, the printer can generally correspond to a conventional inkjet printer, except that the inkjet printhead that ejects drops of ink in the imagewise fashion can be replaced by a suitable UV light printhead that exposes the image forming medium in an imagewise fashion. In this embodiment, the replacement of ink cartridges is rendered obsolete, as writing is conducted using a UV light source. Other suitable imaging techniques that can be used include, but are not limited to, irradiating a UV light onto the image forming medium through a mask, irradiating a pinpoint UV light source onto the image forming medium in an imagewise manner such as by use of a light pen, and the like.

For erasing an image in order to reuse the imaging substrate, in various exemplary embodiments, the substrate can be exposed to a suitable imaging light, to cause the image to be erased. Such erasure can be conducted in any suitable manner, such as by exposing the entire substrate to the erasing light at once, exposing the entire substrate to the erasing light in a successive manner such as by scanning the substrate, or the like. In other embodiments, erasing can be conducted at particular points on the substrate, such as by using a light pen, or the like.

Because water is generated as a by-product in the reaction between the base and the coupling agent, a post-imaging heating step may be applied to the imaged print substrate. The heating step can be employed to evaporate or drive off some or all of the generated water. Remaining water can cause a reverse reaction to occur, and thus water is desirably evaporated from the imaged print substrate. Such a heating step can be conducted in any suitable manner and using any suitable heating device, such as a radiant heater, heated pressure rollers, or the like, where the imaged print substrate is heated to a temperature of from about 100° C. to about 300° C. or more, such as from about 100° C. or about 110° C. or about 120° C. to about 150° C. or about 175° C. or about 200° C. The heating can be for any suitable and desired time, with a heating time of about 50 milliseconds to about 10 seconds generally being sufficient.

According to various exemplary implementations, the color contrast that renders the image visible to an observer may be a contrast between, for example two, three or more different colors. The term "color" may encompass a number of aspects such as hue, lightness and saturation, where one color may be different from another color if the two colors differ in at least one aspect. For example, two colors having the same hue and saturation but are different in lightness would be considered different colors. Any suitable colors such as, for example, red, white, black, gray, yellow, cyan, magenta, blue, and purple, can be used to produce a color contrast as long as the image is visible to the naked eye of a user. However, in terms of desired maximum color contrast, a desirable color contrast is a dark gray or black image on a light or white background, such as a gray, dark gray, or black image on a white background, or a gray, dark gray, or black image on a light gray background.

In various exemplary embodiments, the color contrast may change such as, for example, diminish during the visible time, but the phrase "color contrast" may encompass any degree of color contrast sufficient to render an image discernable to a user regardless of whether the color contrast changes or is constant during the visible time.

In still other embodiments, the writing process on the imaging substrate can be conducted without the use of UV light exposure. For example, if a writing instrument is used that contains a basic substance such as amine, such as a pen, then the writing instrument can be used to directly apply the basic substance to the imaging substrate. By directly applying a basic substance, the applied basic substance can react with the coupling agent to provide the colored image. Similarly, erasure of an image on the substrate can be conducted without the use of UV light exposure. For example, if a writing instrument is used that contains an acidic substance, such as a pen, then the writing instrument can be used to directly apply the acidic substance to the imaging substrate. By directly applying an acidic substance, the applied acidic substance can react with the existing extended conjugation material to reverse the image-forming reaction and thus erase the colored image. In these embodiments, the imaging substrate can be provided either including both the photobase generator and the photoacid generator, one or the other, or neither, and writing and/or erasing can be conducted using only an applied basic or acidic substance.

An example is set forth hereinbelow and is illustrative of different compositions and conditions that can be utilized in practicing the disclosure. All proportions are by weight unless otherwise indicated. It will be apparent, however, that the disclosure can be practiced with many types of compositions and can have many different uses in accordance with the disclosure above and as pointed out hereinafter.

EXAMPLES

Example 1

White Background Cyan Image

An image forming medium is made by coating an imaging composition on a paper substrate. The imaging composition is formed by mixing 2-chloro-1,4-benzoquinone as a coupling agent, O-acyloxime as photobase generator, and 2-nitrobenzyl ester as photoacid generator in a solution containing polymethylmethacrylate dissolved in tetrahydrofuran as a solvent. Xerox 4024 white paper is coated with this solution by using a blade, with a gap of 5 mils. The paper is allowed to dry in room conditions or is heated at about 50° C. for faster evaporation. The components in the coating layer react under first UV exposure to form a colored image as follow:

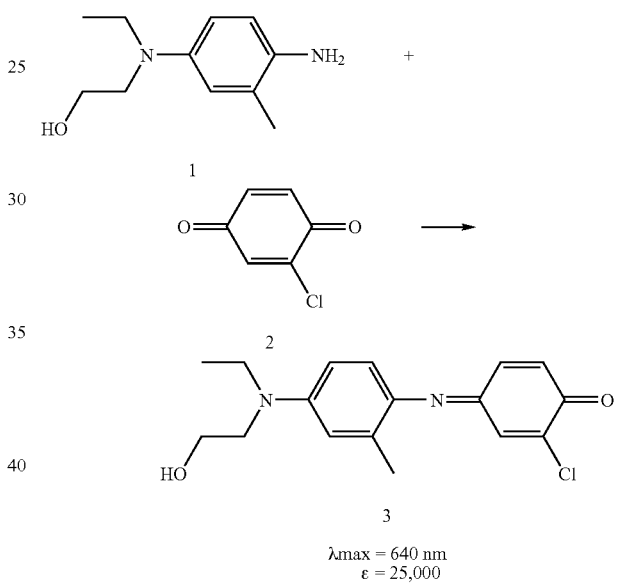

$\lambda max = 640$ nm
$\varepsilon = 25,000$

The components in the coating layer react under second UV exposure to erase a formed image by reversing the reaction of forming the extended conjugation compound (3)

Initially, the paper is white (no Schiff base present). Exposure to UV light at a wavelength of 365 nm generates the amine. The UV light is produced from an UV LED printbar. The UV exposure generates the amine (1), which reacts with coupling agent (2) to produce the Schiff base compound (3) responsible for the cyan coloration. The printed image is stable against ambient exposure on the paper. However, exposure to a different UV light, such as at a wavelength of 254 nm, generates an acid, which reacts with the Schiff base compound (3) regenerate the separate photobase generator and coupling agent, responsible for erasing the cyan coloration. The erased image is also stable against ambient exposure on the paper.

It will be appreciated that various of the above-disclosed and other features and functions, or alternatives thereof, may be desirably combined into many other different systems or applications. Also that various presently unforeseen or unanticipated alternatives, modifications, variations or improvements therein may be subsequently made by those skilled in the art which are also intended to be encompassed by the following claims.

What is claimed is:

1. An image forming medium, comprising
a substrate; and
an imaging layer coated on or impregnated into said substrate, the imaging layer comprising:
a photobase generator,
a coupling agent, and
a photoacid generator,
wherein:
the photobase generator and the coupling agent are selected so that irradiation of the imaging layer with light of a first wavelength causes said photobase generator to generate a base that reacts with the coupling agent to produce an extended conjugation that forms an image,
the photoacid generator is selected so that irradiation of the imaging layer with light of a second wavelength causes said photoacid generator to generate an acid that reacts with the extended conjugation to reverse formation of the extended conjugation to erase the image, and
the first wavelength is different from the second wavelength.

2. The image forming medium of claim 1, wherein the imaging layer further comprises a film-forming medium, and said photobase generator, said coupling agent, and said photoacid generator are dispersed in the film-forming medium.

3. The image forming medium of claim 2, wherein the film-forming medium is selected from the group consisting of a solvent, a polymer binder, microcapsules, a liquid crystal material, and a matrix material.

4. The image forming medium of claim 2, wherein the film-forming medium is a polymer binder selected from the group consisting of polyalkylacrylates, polycarbonates, polyethylenes, oxidized polyethylene, polypropylene, polyisobutylene, polystyrenes, poly(styrene)-co-(ethylene), polysulfones, polyethersulfones, polyarylsulfones, polyarylethers, polyolefins, polyacrylates, polyvinyl derivatives, cellulose derivatives, polyurethanes, polyamides, polyimides, polyesters, silicone resins, epoxy resins, polyvinyl alcohol, polyacrylic acid, polystyrene-acrylonitrile, polyethylene-acrylate, vinylidenechloride-vinylchloride, vinylacetate-vinylidene chloride, styrene-alkyd resins, poly(methacrylic acid), poly[1-2-(hydroxyethyl)aziridine0], Poly(N-hydroxyethyl)ethyleneimine, poly(ethyleneimine), poly (N-acetyl) ethyleneimine, poly(acrylamide), poly allylamine, poly (sodium styrene sulfonate) and mixtures thereof.

5. The image forming medium of claim 1, wherein:
the photobase generator is selected from the group consisting of o-acyloximes, benzoyloxycarbonyl derivatives, photoactive carbamates, oxime ester compounds, ammonium compounds, benzoin compounds, dimethoxybenzyl urethane compounds, orthonitrobenzyl urethane compounds, aromatic sulfonamides, alpha-lactams, N-(2-arylethenyl) amides, N-substituted 4-(o-nitrophenyl)dihydroxypyridines, N-(2-nitrobenzyloxycarbonyl)piperidine, 1,3-bis(N-(2-nitrobenzyloxycarbonyl)-4-piperidyl]propane, N,N'bis (2-nitrobenzyloxycarbonyl)dihexylamine, and O-benzylcarbonyl-N-(1-phenylethylidene)hydroxylamine, and mixtures thereof, and
the photoacid is selected from the group consisting of aryldiazonium salts, diaryl halonium salts, triaryl sulfonic salts, aryl sulfonium salts, aryl iodonium salts, nitrobenzyl compounds such as nitrobenzyl esters, acetophenone derivative compounds such as sulfonyl acetophenones, sulfones, phosphates, diazomethane compounds, onium salt compounds, sulfonimide compounds, disulfone compounds, sulfonic acid derivative compounds, benzoin tosylate compounds, iron arene complexes, halogen-containing triazine compounds, and cyano-containing oxim sulfonate compounds, and mixtures thereof.

6. The image forming medium of claim 1, wherein irradiation with the light of the first wavelength causes the base and the coupling agent to react to form a Schiff base, and irradiation with the light of the second wavelength causes the Schiff base to unconjugate.

7. The image forming medium of claim 1, wherein the coupling agent is selected from the group consisting of aldehydes, ketones, and mixtures thereof.

8. The image forming medium of claim 1, wherein the coupling agent is selected from the group consisting of aryl aldehydes, alkyl aldehydes, arylalkyl aldehydes, 1,2 or 1,4 quinones, cyclic ketones, diaryl ketones, and aryl-alkyl ketones, each optionally substituted with functional groups like alkyl radicals, electron withdrawing groups or with electron donating functional groups.

9. The image forming medium of claim 1, wherein the photobase generator, the coupling agent, and the photoacid generator are selected such that said image is selected from the group consisting of a monochrome image, a grayscale image, and a multicolor image.

10. The image forming medium of claim 1, wherein the imaging layer further comprises a photosensitizer that sensitizes only one of the photobase generator and the photoacid generator.

11. The image forming medium of claim 1, wherein the irradiation with the light of the first wavelength and the irradiation with the light of the second wavelength does not irreversibly consume the photobase generator, coupling agent, or photoacid generator.

12. The image forming medium of claim 1, wherein at least one of the irradiation with the light of the first wavelength and the irradiation with the light of the second wavelength irreversibly consumes at least part of at least one of the photobase generator, the coupling agent, and the photoacid generator.

13. The image forming medium of claim 1, wherein the photobase generator, the coupling agent, and the photoacid generator is each present in an amount of from about 0.01% to about 20% by weight of a total dry weight of the imaging layer.

14. The image forming medium of claim 1, wherein the substrate is selected from the group consisting of glass, ceramic, wood, plastic, paper, fabric, textile, metals, plan paper, and coated paper.

15. A method of making an image forming medium, comprising applying an imaging layer composition to a substrate, wherein:
the imaging layer composition comprises:
a photobase generator,
a coupling agent, and
a photoacid generator,
wherein:
the photobase generator and the coupling agent are selected so that irradiation of the imaging layer with light of a first wavelength causes said photobase generator to generate a base that reacts with the coupling agent to produce an extended conjugation that forms an image, the photoacid generator is selected so that irradiation of the imaging layer with light of a second wavelength causes said photoacid generator to generate an acid that reacts with the extended conjugation to reverse formation of the extended conjugation to erase the image, and the first wavelength is different from the second wavelength.

16. The method of claim 15, wherein the applying comprises coating the imaging layer over the substrate or impregnating the imaging layer into the substrate.

17. The method of claim 15, wherein the imaging layer composition further comprises a film-forming polymer binder.

18. A method of forming an image, comprising:
providing an image forming medium comprising:
a substrate; and
an imaging layer coated on or impregnated into said substrate, wherein the imaging layer comprises a photobase generator, a coupling agent, and a photoacid generator;
forming an image by exposing the image forming medium to UV irradiation of a first wavelength in an imagewise manner, and
erasing the image by exposing the image forming medium bearing the image to UV irradiation of a second wavelength in an imagewise manner,
wherein:
said UV irradiation of the first wavelength causes said photobase generator to generate a base that reacts with the coupling agent to produce an extended conjugation that forms the image, and
said UV irradiation of the second wavelength causes said photoacid generator to generate an acid that reacts with the extended conjugation to reverse formation of the extended conjugation to erase the image.

19. The method of claim 18, further comprising:
repeating the step of exposing the image forming medium to the UV irradiation of the first wavelength in an imagewise manner at least one additional time.

20. The method of claim 18, wherein the exposing is for a time period ranging from about 10 milliseconds to about 5 minutes at an intensity ranging from about 0.1 mW/cm$^2$ to about 100 mW/cm$^2$.

21. The method of claim 18, further comprising heating the image forming medium after said exposing to evaporate water formed during the exposing step.

22. An imaging system, comprising:
the image forming medium of claim 1; and
a printer comprising a first UV irradiation source and a second UV irradiation source, wherein the first UV irradiation source sensitizes the photobase generator and the second UV irradiation source sensitizes the photoacid generator.

23. The image forming medium of claim 1, wherein the image forming medium is an inkless reimageable printing paper.

24. The image forming medium of claim 1, wherein the imaging layer is configured to form cyan, magenta, and yellow colors.

* * * * *